United States Patent
Lahiri et al.

(10) Patent No.: US 10,027,333 B2
(45) Date of Patent: Jul. 17, 2018

(54) PHASE LOCKED LOOPS HAVING DECOUPLED INTEGRAL AND PROPORTIONAL PATHS

(71) Applicant: STMicroelectronics International N.V., Amsterdam (NL)

(72) Inventors: Abhirup Lahiri, Delhi (IN); Nitin Gupta, Kurukshetra (IN); Gagan Midha, Noida (IN)

(73) Assignee: STMICROELECTRONICS INTERNATIONAL N.V., Amsterdam (NL)

( * ) Notice: Subject to any disclaimer, the term of this patent is extended or adjusted under 35 U.S.C. 154(b) by 0 days.

(21) Appl. No.: 15/356,335

(22) Filed: Nov. 18, 2016

(65) Prior Publication Data

US 2018/0145695 A1    May 24, 2018

(51) Int. Cl.
| | | |
|---|---|---|
| H03L 7/093 | (2006.01) | |
| H03L 7/08 | (2006.01) | |
| H03L 7/099 | (2006.01) | |
| H03L 7/089 | (2006.01) | |

(52) U.S. Cl.
CPC ............ *H03L 7/093* (2013.01); *H03L 7/0802* (2013.01); *H03L 7/0893* (2013.01); *H03L 7/0895* (2013.01); *H03L 7/0896* (2013.01); *H03L 7/0991* (2013.01)

(58) Field of Classification Search
CPC .... H03L 7/0896; H03L 7/0895; H03L 7/0893
See application file for complete search history.

(56) References Cited

U.S. PATENT DOCUMENTS

| | | | | |
|---|---|---|---|---|
| 6,147,530 A * | 11/2000 | Nogawa | ..................... | H03L 7/07 327/107 |
| 6,204,719 B1 * | 3/2001 | Gilbert | ................... | G01R 19/02 327/346 |
| 7,135,900 B2 * | 11/2006 | Sohn | ..................... | H03L 7/0891 327/148 |
| 7,692,458 B1 * | 4/2010 | Eker | ..................... | H03L 7/0896 327/148 |
| 2005/0035797 A1 * | 2/2005 | Frans | ..................... | H03L 7/0812 327/156 |
| 2005/0134305 A1 * | 6/2005 | Stojanovic | ............ | H04L 25/028 326/31 |
| 2008/0061850 A1 * | 3/2008 | Watanabe | ............. | H03L 7/0893 327/157 |
| 2012/0153999 A1 * | 6/2012 | Kim | ..................... | H03L 7/0816 327/157 |
| 2017/0155396 A1 * | 6/2017 | Hiraku | ..................... | H03L 7/095 |

OTHER PUBLICATIONS

Koo, Yido et al., "A Fully Integrated CMOS Frequency Synthesizer With Charge-Averaging Charge Pump and Dual-Loop Filter for PCS- and Cellular-CDMA Wireless Systems," IEEE Journal of Solid-State Circuits, vol. 37, Issue 5, May 2002, pp. 536-542.

* cited by examiner

*Primary Examiner* — Thomas J Hiltunen
(74) *Attorney, Agent, or Firm* — Slater Matsil, LLP

(57) ABSTRACT

An embodiment circuit includes a first charge pump configured to generate a first current at a first node, and a second charge pump configured to generate a second current at a second node. The circuit further includes an isolation buffer coupled between the first node and the second node and an adder having a first input coupled to the second node. The circuit additionally includes an auxiliary charge pump configured to generate a third current at a second input of the adder, and an oscillator having an input coupled to an output of the adder.

20 Claims, 4 Drawing Sheets

PHASE LOCKED LOOPS HAVING DECOUPLED INTEGRAL AND PROPORTIONAL PATHS

TECHNICAL FIELD

The present disclosure relates generally to a phase locked loop, and, in particular embodiments, to a phase locked loop having decoupled integral and proportional paths.

BACKGROUND

Electronic devices use phase-locked loops to manipulate electronic signals. A phase-locked loop (PLL) circuit is a control system that generates an output signal having a phase and frequency that is related to (e.g. identical or proportional to) the phase and frequency of an input signal, which is often referred to as a reference signal. The PLL circuit compares the phase of the input signal with the phase of the signal at the output of the PLL circuit and adjusts the frequency of an oscillator (e.g. a voltage-controlled oscillator), included in the PLL circuit, to keep the phase of the generated output signal matched to the phase of the input signal. By keeping the phases of these signals locked to each other, it can be assured that the frequency of the output signal also matches the frequency of the input signal or an integer multiple of the frequency of the input signal.

Keeping the input and output signals locked to the same frequency allows for signal processing and communication to occur at higher speeds. PLL circuits are widely employed in radio, telecommunications, computers, and other electronic applications. In various applications, PLL circuits may be used to recover a signal from a noisy communication channel, generate stable frequencies at a multiple of an input frequency (frequency synthesis), or distribute clock timing pulses in digital logic designs such as microprocessors. Since a single integrated circuit can provide a complete PLL circuit, the technique is used in modern electronic devices, with output frequencies from a fraction of a hertz up to many gigahertz.

As PLL circuits are used in devices having faster speed requirements and having lower power supply voltages, electronic noise (e.g. thermal noise) and device size become significant factors in the design of the PLL circuit.

SUMMARY

In an embodiment, a circuit includes a first charge pump configured to generate a first current at a first node, and a second charge pump configured to generate a second current at a second node. The circuit further includes an isolation buffer coupled between the first node and the second node and an adder having a first input coupled to the second node. The circuit additionally includes an auxiliary charge pump configured to generate a third current at a second input of the adder, and an oscillator having an input coupled to an output of the adder.

In an embodiment, a phase locked loop includes a phase detector configured to generate a control signal based on a comparison of a phase of a reference signal to a phase of a feedback signal. The phase locked loop also includes a first charge pump coupled to the phase detector and configured to receive the control signal from the phase detector, and a second charge pump coupled to the phase detector and configured to receive the control signal from the phase detector. The phase locked loop further includes a filter coupled between the first charge pump and the second charge pump, where a first terminal of the filter is coupled to an output of the first charge pump at a first node, and where a second terminal of the filter is coupled to an output of the second charge pump at a second node. The phase locked loop additionally includes an adder having a first terminal coupled to the second node, an auxiliary charge pump having an output coupled to a second terminal of the adder, and an oscillator having an input coupled to an output of the adder.

In an embodiment, a method includes generating a feedback signal based on a first control signal comprising an integer portion, a fractional portion, and a quantization noise component; comparing the feedback signal with a reference signal; and generating a first at a first node based on the comparison of the feedback signal with the reference signal. The method further includes generating a second current at a second node based on the comparison of the feedback signal with the reference signal, the second current being greater than the first current and filtering the first current using a first filter path. The method additionally includes filtering the second current using a second filter path different from the first filter path, where the second filter path is decoupled from the first filter path by an isolating buffer coupled between the first filter path and the second filter path. The method also includes generating a second control signal based on the quantization noise component of the first control signal; generating a third current based on the second control signal; subtracting the third current from the second current to produce a tuning voltage; and generating an oscillating signal based on the tuning voltage.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Figure 1:
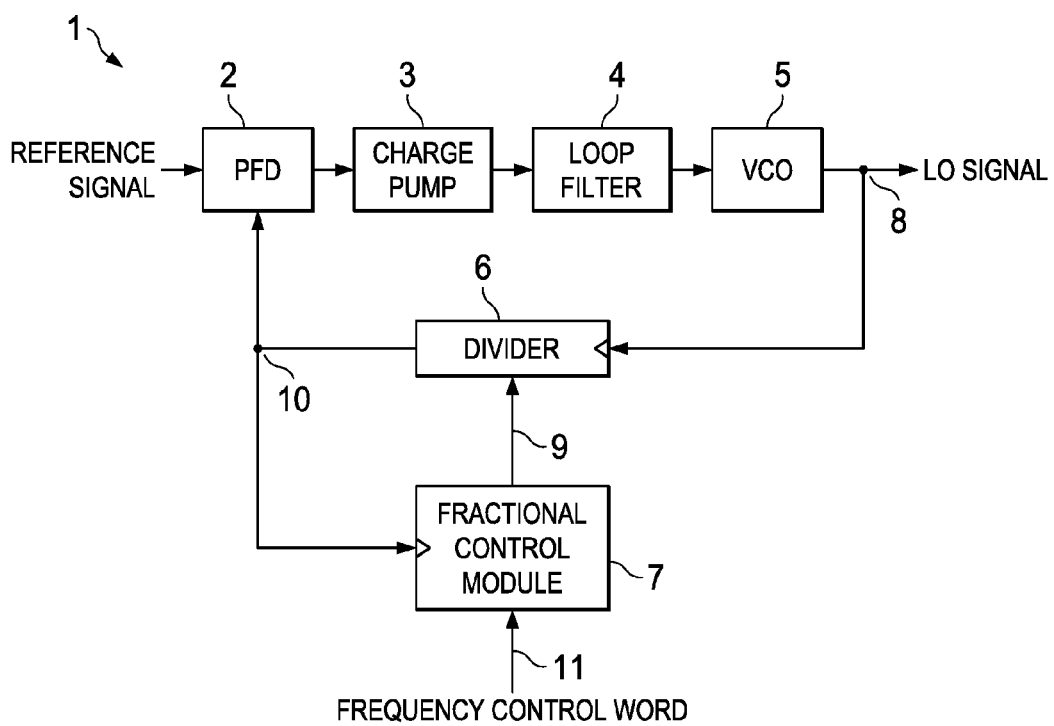
FIG. 1 shows a simplified block diagram of a fractional-N phase-locked loop.

FIG. 1 shows a simplified block diagram of a fractional-N phase-locked loop (PLL) 1. The PLL 1 may, for example, be used to tune the frequency of a local oscillator (LO) signal, where the LO signal is supplied to a mixer of a receiver in the cellular telephone such that the receiver is tuned to receive a radio signal of interest. The PLL 1 includes a phase frequency detector (PFD) 2, a single charge pump 3, a loop filter 4, a voltage-controlled oscillator (VCO) 5, a divider 6, and a fractional control module 7 (which may be a sigma-delta modulator). Divider 6 divides the frequency of the LO signal on node 8 by a multi-bit digital divisor value received on signal line 9, and outputs the resulting lower frequency feedback clock signal onto node 10. PFD 2 compares the phases of a reference signal and the feedback clock signal at node 10 and outputs a control signal to the single charge pump 3 based on the comparison. The single charge pump 3 provides a current to the loop filter 4, which subsequently filters the received current. The loop filter 4 provides a signal (e.g. a voltage) to VCO 5 (e.g. on the tuning line of the VCO). The VCO then varies the phase of the LO signal based on the signal received on its tuning line from the loop filter 4. Fractional control module 7 varies the multi-bit digital divisor value on signal line 9 over time such that the frequency of the LO signal on node 8 divided by the frequency of the feedback clock signal on node 10 is a fractional-N divisor value over time. The fractional-N divisor value can be changed by changing a multi-bit frequency control word received at fractional control module 7 via signal line ii. The frequency of the LO signal on node 8 is adjusted to tune the receiver by adjusting the multi-bit digital frequency control word. Fractional control module 7 may generate quantization noise, which can detrimentally affect performance of PLL 1.

Various methods are available for removing or substantially reducing quantization noise generated by the fractional control module 7. One such method is to reduce a bandwidth of PLL 1 to filter the quantization noise from fractional control module 7. The bandwidth of PLL 1 can be reduced by increasing the capacitance of a capacitor included in the loop filter 4 that determines the zero value of the PLL 1. However, reducing the bandwidth of PLL 1 can increase noise (e.g. oscillator phase noise) generated by the VCO 5. Additionally, increasing the capacitance of the capacitor of the loop filter 4 can lead to high PLL area. Another method is a low-area solution in which the current supplied by the single charge pump 3 is reduced. However, reducing the current supplied by the single charge pump 3 can increase charge pump noise. Furthermore, this method increases mismatch and non-linearity in the single charge pump 3, and this may lead to noise folding thereby increasing the noise floor of the fractional control module 7 at lower offset frequencies, which can, in turn, increase the noise contribution of the fractional control module 7 to the overall jitter of the PLL 1. As such, methods of cancelling or substantially reducing quantization noise in fractional-N PLLs may be desirable.

Embodiment circuits described herein provide several advantages. Embodiments provide a PLL that has reduced area and reduced noise. In particular, embodiment PLL circuits include dual charge pumps and an isolation buffer that decouples the integral path and the proportional path of the PLL. This allows for independent control over the integral and proportional paths of the PLL without altering the loop parameters of the PLL. Such independent control over the integral and proportional paths of the PLL allows for capacitance multiplication in the integral path by the simultaneous reduction of the current in the charge pump in the integral path and the capacitance of a capacitor in the integral path that determines the zero of the PLL. This leads to the saving of large area typically required for a capacitor that determines a zero of the PLL. Additionally, the independent control over the integral and proportional paths allows for configuration of the charge pump in the proportional path such that it has a greater current compared to the charge pump in the integral path of the PLL. This allows for the effective reduction of quantization noise in the proportional path, which in turn reduces spurious tones and jitter at the output of the PLL.

Figure 2:
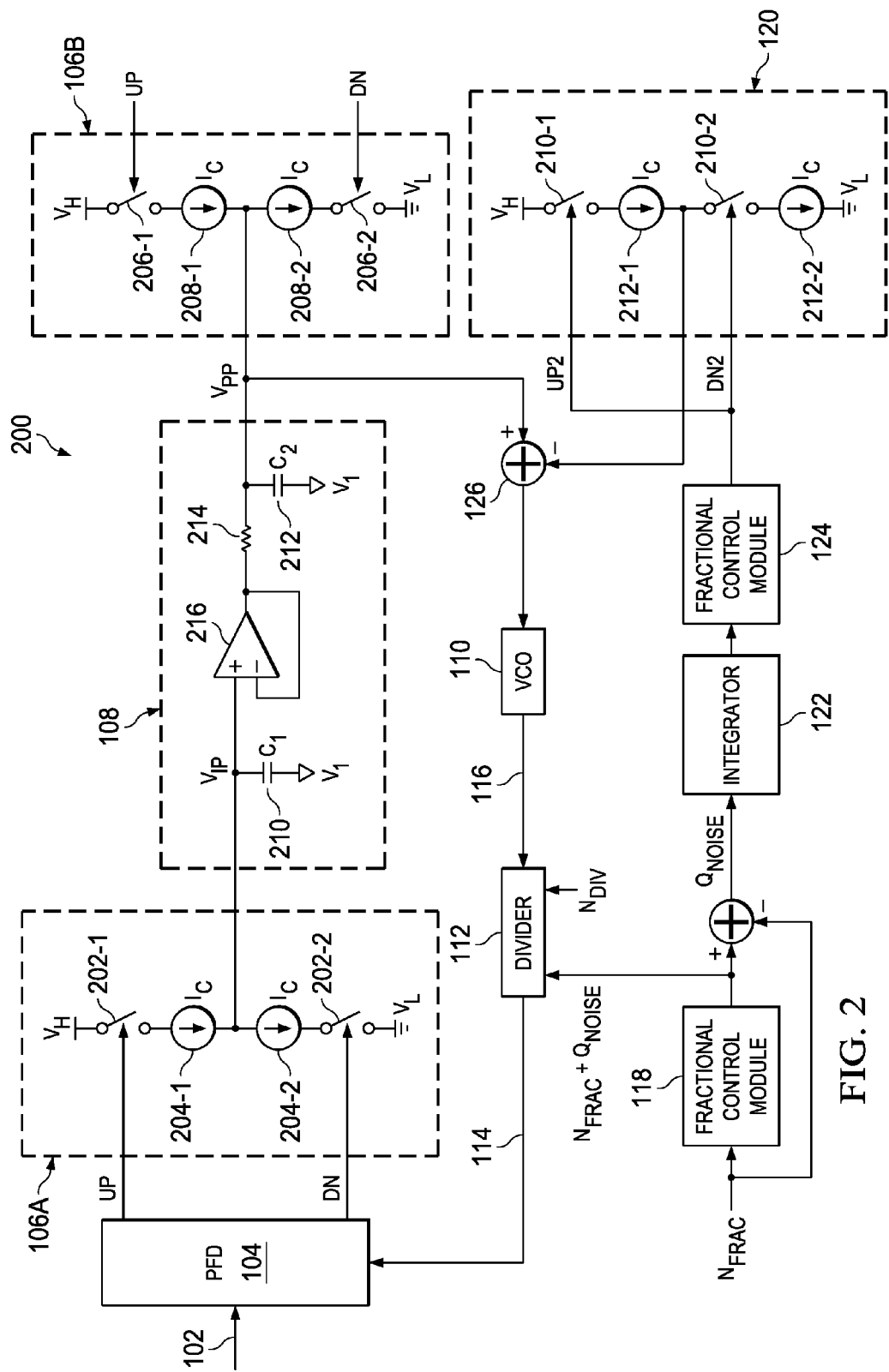
FIG. 2 shows a block diagram of a fractional-N phase-locked loop having dual charge pumps and an auxiliary charge pump, in accordance with an embodiment.

FIG. 2 shows a block diagram of a fractional-N PLL 200 having dual charge pumps 106A, 106B and an auxiliary charge pump 120, in accordance with an embodiment. The PLL 200 includes an input signal 102, a phase frequency detector (PFD) 104, a first charge pump 106A, a second charge pump 106B, a loop filter 108, a voltage-controlled oscillator (VCO) 110, a frequency divider 112, a feedback signal 114, an output signal 116, a fractional control module 118, and an auxiliary charge pump 120. The PLL 200 may be an analog fractional-N PLL or a digital fractional-N PLL. The components and blocks of FIG. 2 are shown merely by way of illustration. Other PLL implementations may contain more or fewer components/blocks. In particular, the embodiments of the present disclosure can be implemented in other applications of feedback loops.

The PLL 200 (e.g. the PFD 104 of PLL 200) receives an input signal 102 (sometimes referred to as a reference signal) having a frequency fref, and generates an output signal 116 (e.g. from VCO 110 of PLL 200) having a frequency fvco. The output signal 116 has substantially the same phase as the input signal 102. The ratio fvco/fref may be determined by a divide factor applied by the frequency divider 112, which may be determined by the fractional control module 118. This is described in greater detail below in respect of the fractional control module 118.

The PFD 104 compares the input signal 102 and the feedback signal 114 (which is output from the divider 112) and produces a control signal, which is used to control the first charge pump 106A and second charge pump 106B. Each of the charge pumps 106A and 106B receives the control signal produced by the PFD 104. The control signal provided by the PFD 104 to the first charge pump 106A and the second charge pump 106B may be one of a phase-indicator up signal (shown in FIG. 2 as "UP") or a phase-indicator down signal (shown in FIG. 2 as "DN").

As shown in FIG. 2, each of the charge pumps 106A and 106B includes a high-side leg coupled to a high voltage node $V_H$ and a low-side leg coupled to a low voltage node $V_L$. The high voltage node may be a power supply voltage $V_{DD}$ and the low voltage node may be a low reference voltage, such as ground. The high-side leg of the first charge pump 106A includes an electronic switch 202-1 and a current source 204-1. The electronic switch 202-1 is connected in series between the current source 204-1 and the high voltage node $V_H$. The low-side leg of the first charge pump 106A includes an electronic switch 202-2 and a current source 204-2. The electronic switch 202-2 is connected in series between the current source 204-2 and the low voltage node $V_L$.

The high-side leg of the second charge pump 106B includes an electronic switch 206-1 and a current source 208-1. The electronic switch 206-1 is connected in series between the current source 208-1 and the high voltage node $V_H$. The low-side leg of the second charge pump 106B includes an electronic switch 206-2 and a current source 208-2. The electronic switch 206-2 is connected in series between the current source 208-1 and the low voltage node $V_L$.

The high-side leg and the low-side leg of the first charge pump 106A are coupled to each other and form an output node $V_{IP}$ (Voltage of the Integral Path) of the first charge pump 106A, while the high-side leg and the low-side leg of the second charge pump 106B are coupled to each other and form an output node $V_{PP}$ (Voltage of the Proportional Path) of the second charge pump 106B.

The electronic switches 202-1 and 206-1 of the high-side legs of the charge pumps 106A, 106B are controlled by the phase-indicator up signal UP, while the electronic switches 202-2 and 206-2 of the low-side legs of the charge pumps 106A, 106B are controlled by the phase-indicator down signal DN. In operation, when the phase-indicator up signal UP and the phase-indicator down signal DN provided to the first charge pump 106A are configured such that the electronic switch 202-1 of the high-side leg is closed while the electronic switch 202-2 of the low-side leg is open, the first charge pump 106A sources current from the current source 204-1 to the node $V_{IP}$. Conversely, when the phase-indicator up signal UP and the phase-indicator down signal DN provided to the first charge pump 106A are configured such that the electronic switch 202-1 of the high-side leg is open while the electronic switch 202-1 of the low-side leg is closed, the first charge pump 106A sinks the current to the current source 204-2 from the node $V_{IP}$. Hence, the current source 204-1 injects a positive current proportional to the phase difference of the input signal 102 and the feedback signal 114 into the node $V_{IP}$, while the current source 204-2 injects a negative current (e.g. draws a current) proportional to the phase difference of the input signal 102 and the feedback signal 114 from the node $V_{IP}$.

Likewise, in operation, when the phase-indicator up signal UP and the phase-indicator down signal DN provided to the second charge pump 106B are configured such that the electronic switch 206-1 of the high-side leg is closed while the electronic switch 206-2 of the low-side leg is open, the second charge pump 106B sources current from the current source 208-1 to the node $V_{PP}$. Conversely, when the phase-indicator up signal UP and the phase-indicator down signal DN provided to the second charge pump 106B are configured such that the electronic switch 206-1 of the high-side leg is open while the electronic switch 206-2 of the low-side leg is closed, the second charge pump 106B sinks current to the current source 208-2 from the node $V_{PP}$. Hence, the current source 208-1 injects a positive current proportional to the phase difference of the input signal 102 and the feedback signal 114 into the node $V_{PP}$, and the current source 208-2 injects a negative current (e.g. draws a current) proportional to the phase difference of the input signal 102 and the feedback signal 114 from the node $V_{PP}$.

The loop filter 108 includes a first filter path and a second filter path. The first filter path is coupled to the node $V_{IP}$, while the second filter path is coupled to the node $V_{PP}$. The first filter path includes a capacitor 210 coupled between the node $V_{IP}$ and a reference node $V_1$. The node $V_{IP}$ supplies current signals to the first filter path of the loop filter 108. In some embodiments, capacitor 210 determines the zero value of loop filter 108 and/or the zero value of the PLL 200. The reference node $V_1$ may be referred to as the common node (supply or ground or some other common voltage, for example) of the loop filter 108 and/or the VCO 110. The first filter path is sometimes referred to as an integral path since the capacitor 210 integrates the current from the first charge pump 106A to provide an average frequency to isolation buffer 216.

The second filter path includes a capacitor 212 coupled between the node $V_{PP}$ and the reference node $V_1$ and a resistor 214 coupled between the output of the isolation buffer 216 and the node $V_{PP}$. The node $V_{PP}$ supplies current signals to the second filter path of the loop filter 108. The second filter path is sometimes referred to as a proportional path since the resistor 214 provides an instantaneous phase correction without affecting the average frequency. The second filter path is output to the VCO 110. In particular, the signal at the node $V_{PP}$ is provided as an input to the adder 126, which is coupled between the node $V_{PP}$ and the VCO 110.

The first and second filter paths are separated by an isolation buffer 216. In the illustrated embodiment, the isolation buffer 216 is implemented as an operational amplifier (op-amp) configured as a unity gain buffer with the node $V_{IP}$ coupled to the non-inverting input of the op-amp and the output of the op-amp fed back to the inverting input of the op-amp. In some embodiments, the isolation buffer 216 is a single-stage op-amp and is biased with a current of about 50 μA. In other embodiments, the isolation buffer 216 may be a cascade of two or more source followers/emitter follower circuits, or any other suitable isolation circuit. An effect of the isolation buffer 216 is to decouple and separate the currents provided by the first charge pump 106A and the second charge pump 106B. As such, the isolation buffer 216 decouples the integral path of PLL 200 from the proportional path of PLL 200. Stated in another way, use of the isolation buffer 216 in conjunction with the dual charge pumps 106A and 106B allows for independent control over the integral and proportional paths without altering the loop parameters of PLL 200.

The VCO 110 generates a periodic output signal 116 based on the output of the isolation buffer 216 and/or the output of the second charge pump 106B. If, initially, the VCO 110 is set to be substantially the same frequency as the input signal 102, then small adjustments through the feedback signal 114 may keep the phases of the output signal 116 and the input signal 102 locked to within a desired threshold. If, however, the phase from the VCO 110 is determined to lag behind that of the input signal 102, the PFD 104 may adjust the control signals to the VCO 110 so that the frequency of the signal generated by the VCO is increased. Likewise, if the phase from the VCO 110 is determined to lead that of the input signal 102, the PFD 104 may adjust the control signals to the VCO 110 so that the frequency of the signal generated by the VCO is decreased. The VCO 110 may be a voltage-controlled low noise oscillator including resonators, a voltage-controlled ring oscillator, or any other suitable voltage-controlled oscillator. In some embodiments, the VCO 110 may include a voltage-to-current convertor and a current-controlled oscillator (CCO).

The output signal 116 from the VCO 110 is provided to the frequency divider 112, which is configured to operate on the output signal 116 such that the frequency of the output signal 116 is a multiple of the frequency of the input signal 102. In some embodiments, such as in the example of FIG. 2, the frequency of the output signal 116 is, on average, a non-integer multiple of the frequency of the input signal 102. This may be accomplished coupling the fractional-N control module 118 to the frequency divider 112, thereby implementing a fractional-N PLL. A fractional-N PLL can achieve a frequency step much smaller than its reference and still maintain reasonably high reference frequency, which may be important for achieving low phase noise performance.

The fractional control module 118 may include or may be implemented by an accumulator or a sigma-delta (ΣΔ) modulator to dynamically determine or control the divider ratio of the frequency divider 112. The instantaneous divide ratio of the frequency divider 112 can only be an integer number, but the long-term average of the divide ratio is ($N_{DIV}$+$N_{FRAC}$), where $N_{DIV}$ is an integer portion of the divide ratio and $N_{FRAC}$ is a fractional portion of the divide ratio. For example, if the desired divide ratio is 4.75, then $N_{DIV}$=4 and $N_{FRAC}$=0.75. One example of how the fractional control module 118 achieves this divide ratio is by selecting one of several integer divide ratios slightly above or below $N_{DIV}$ for a period of time. By switching between the available integer divide ratios, the desired average divide ratio can be achieved as an average over time, even though the instantaneous divide ratio is an integer. For example, to achieve an average divide ratio of 4.75, the fractional control module 118 could use a divide ratio of 4 for 25% of the time and a divide ratio of 5 for 75% of the time. Actual fractional control module 118 implementations may use more sophisticated algorithms with, for example, more integer divide ratios, or a modulus function, to attempt to minimize and shape the resulting noise.

In the example shown in FIG. 2, the integer portion $N_{DIV}$ is provided to the frequency divider 112, while fractional portion $N_{FRAC}$ is provided to the fractional control module 118. The $N_{FRAC}$ is subsequently provided by the fractional control module 118 to the frequency divider 112. However, as depicted in the example of FIG. 2, the value provided by the fractional control module 118 to the frequency divider 112 may include quantization noise (indicated in FIG. 2 as $Q_{NOISE}$). The quantization noise $Q_{NOISE}$ may contribute to output jitter of PLL 200 and may detrimentally affect the performance of PLL 200.

The loop bandwidth of PLL 200 can be reduced to filter out the quantization noise $Q_{NOISE}$ resulting from the fractional control module 118. However, this may not be feasible since the PLL 200 may need a high loop bandwidth to remove other sources of noise, such as noise generated by the VCO 110. The PLL 200 may also need a high loop bandwidth to speed up a lock-in time for applications that requires fast switching speed, such as Bluetooth.

In some embodiments, the quantization noise $Q_{NOISE}$ generated by the fractional control module 118 may occur at or may be pushed to a high frequency offset. As an example, quantization noise $Q_{NOISE}$ may be frequency-shaped such that a majority of its energy occurs at or around fref/2. This is subsequently high-pass filtered so that the quantization noise $Q_{NOISE}$ has less energy content around DC (e.g. at or around 0 Hz). As depicted by the signal paths shown in FIG. 2, the quantization noise $Q_{NOISE}$ may propagate through the integral path of the PLL 200 and the proportional path of the PLL 200. As an example, with regards to the integral path of the PLL 200, the quantization noise $Q_{NOISE}$ may contaminate or affect the feedback signal 114, which is provided to the PFD 104. The PFD 104 may update the phase-indicator up signal UP and the phase-indicator down signal DN provided to the first charge pump 106A based on a comparison between the input signal 102 and the contaminated or erroneous feedback signal 114. However, the quantization noise $Q_{NOISE}$ through the integral path of the PLL 200 is filtered (e.g. low-pass filtered) by the loop filter 108. In particular, frequency components of the quantization noise $Q_{NOISE}$ through the integral path may be low-pass filtered beyond the zero value of the PLL 200, and thus, the quantization noise $Q_{NOISE}$ (and other sources of noise, such as thermal noise) through the integral path may be compensated or corrected by the loop filter 108, and therefore not significantly contribute to output jitter of the PLL 200.

On the other hand, with regards to the proportional path of the PLL 200, the quantization noise $Q_{NOISE}$ may contaminate or affect the feedback signal 114, which is provided to the PFD 104. The PFD 104 may update the phase-indicator up signal UP and the phase-indicator down signal DN provided to the second charge pump 106B based on a comparison between the input signal 102 and the contaminated or erroneous feedback signal 114. Since the output of the second charge pump 106B is coupled to the input of the VCO 110 (e.g. via the adder 126), the quantization noise $Q_{NOISE}$ (and other sources of noise, such as thermal noise) through the proportional path may modulate the tuning line of the VCO 110 and thus create spurious tones at the output signal 116 and/or contribute to output jitter of the PLL 200.

However, as described above in respect of the loop filter 108, use of the isolation buffer 216 in conjunction with dual charge pumps 106A and 106B can allow independent control over the integral and proportional paths of the PLL 200 without altering the loop parameters of PLL 200 since the integral and proportional paths of PLL 200 are decoupled by isolation buffer 216. Consequently, correction for the quantization noise $Q_{NOISE}$ in the proportional path of the PLL 200 may be performed without substantial effect on the characteristics or performance of the integral path of the PLL 200, and vice versa.

As shown in FIG. 2, the auxiliary charge pump 120 can be used to remove or substantially reduce the quantization noise $Q_{NOISE}$ in the proportional path that may otherwise modulate the tuning line of the VCO 110, without altering the behavior of the integral path of the PLL 200 or the loop parameters of PLL 200. In particular, the quantization noise $Q_{NOISE}$ generated by the fractional control module 118 may be obtained by subtracting the fractional portion $N_{FRAC}$ provided to the fractional control module 118 from the output of the fractional control module 118 (which includes both $N_{FRAC}$ and $Q_{NOISE}$). The quantization noise $Q_{NOISE}$ is subsequently input into an integrator 122, which may convert the frequency domain quantization noise $Q_{NOISE}$ to a phase domain signal. In other words, the integrator 122 may output a phase signal that is representative of the phase difference generated by the quantization noise $Q_{NOISE}$. The output of the integrator 122 is provided to a second fractional control module 124, which outputs a second phase-indicator up signal UP2 and a second phase-indicator down signal DN2 to the auxiliary charge pump 120.

The auxiliary charge pump 120 includes a high-side leg coupled to the high voltage node $V_H$ and a low-side leg coupled to the low voltage node $V_L$. The high-side leg of the auxiliary charge pump 120 includes an electronic switch 210-1 and a current source 212-1. The electronic switch 210-1 is connected in series between the current source 212-1 and the high voltage node $V_H$. The low-side leg of the auxiliary charge pump 120 includes an electronic switch 210-2 and a current source 212-2. The electronic switch 210-2 is connected in series between the current source 212-1 and the low voltage node $V_L$. In operation, when the second phase-indicator up signal UP2 and the second phase-indicator down signal DN2 provided to the auxiliary charge pump 120 are configured such that the electronic switch 210-1 of the high-side leg is closed while the electronic switch 210-2 of the low-side leg is open, the auxiliary charge pump 120 sources current from the current source 212-1 to the subtracting terminal of the adder 126. Conversely, when the second phase-indicator up signal UP2 and the second phase-indicator down signal DN2 provided to the auxiliary charge pump 120 are configured such that the electronic switch 210-1 of the high-side leg is open while the electronic switch 210-2 of the low-side leg is closed, the auxiliary charge pump 120 sinks current to the current source 212-2 from the subtracting terminal of the adder 126. Hence, the current source 212-1 injects a positive current representative of the quantization noise $Q_{NOISE}$ into the subtracting terminal of the adder 126, while the current source 212-2 injects a negative current (e.g. draws a current) representative of the quantization noise $Q_{NOISE}$ from the subtracting terminal of the adder 126. In so doing, effect of the quantization noise $Q_{NOISE}$ on the tuning line of the VCO 110 in the proportional path of PLL 200 is removed or substantially reduced. As an example, frequency content of the quantization noise $Q_{NOISE}$ in the proportional path of the PLL 200 occurring from the zero of the PLL 200 to the cutoff frequency of the PLL 200 can be cancelled or substantially reduced using the auxiliary charge pump 120.

In the example shown in FIG. 2, the current value of the current sources 204-1, 204-2, 208-1, 208-2, 212-1, 212-2 are indicated as being substantially equal at some value $I_C$. Furthermore, the capacitances of capacitors 210 and 212 are indicated as being C1 and C2, respectively. Capacitors 210 and 212 affect the stability of the PLL 200. Since the PLL 200 is a high-order negative feedback system, it may require a zero value using a non-zero valued resistor to provide a suitable phase margin to maintain the stability of the PLL 200. The zero value is determined by the loop filter 108, and typically the zero value is a fraction of the loop bandwidth of the PLL. For such a small zero value, a large capacitance value for the capacitor 210 may be needed in comparison to the capacitance of capacitor 212. For example, for a small zero value, the capacitor 210 may have a value of about 210 pF, the capacitor 212 may have a value of about 8.5 pF, the resistor 214 may have a value of about 4000 Ohms, and the current value of the current sources 204-1, 204-2, 208-1, 208-2, 212-1, and 212-2 may be about 25 µA. Therefore, the capacitor 210 would require a large amount of area and would greatly affect the overall area of the PLL 200. In some embodiments, the capacitors 210 and 212 are implemented using metal-oxide-semiconductor field-effect transistors (MOSFETs). MOSFET capacitors have higher capacitance density than metal capacitors, and thus, using MOSFET capacitors can further reduce the overall area of the PLL 200.

Figure 3:
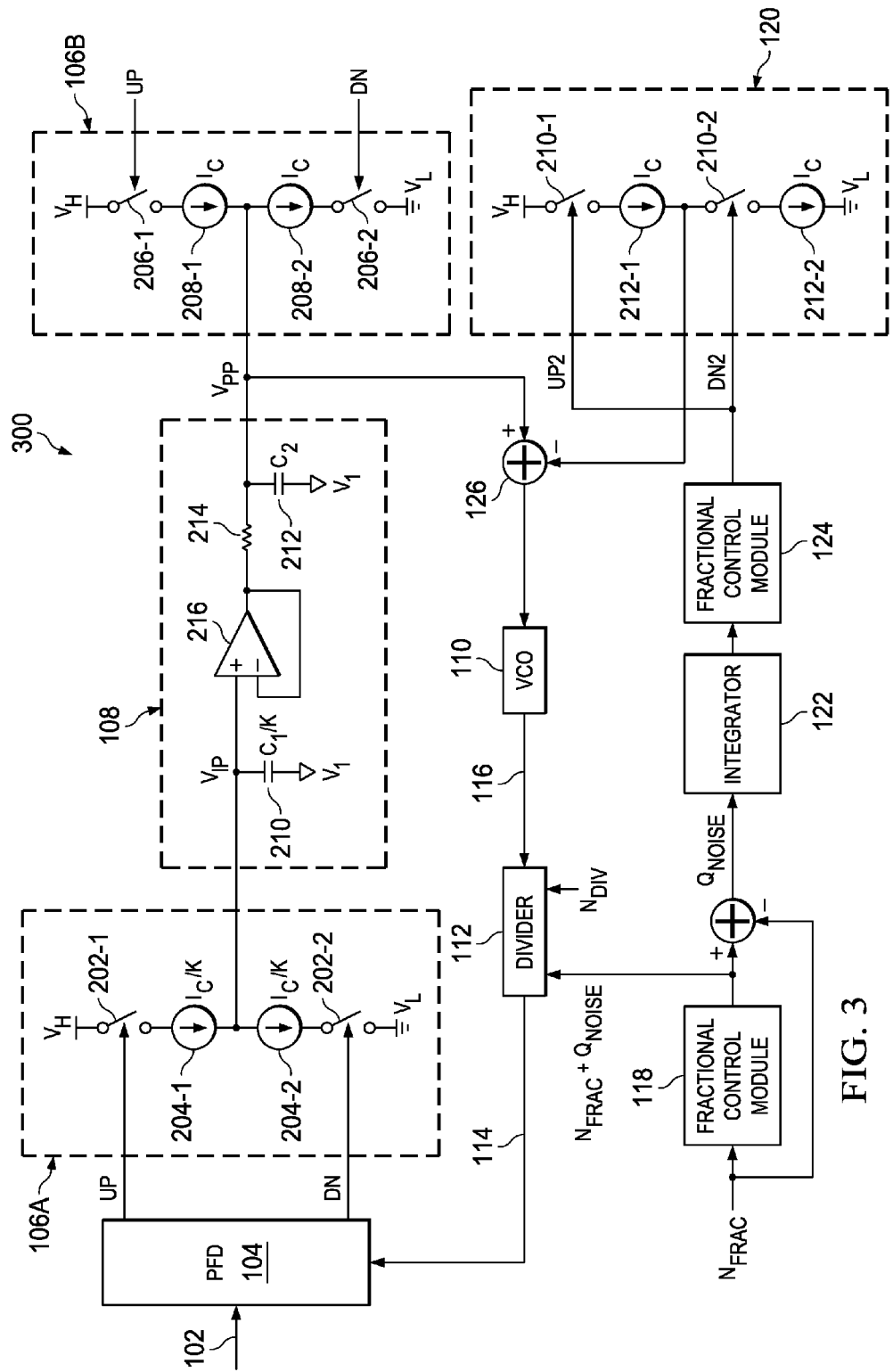
FIG. 3 shows a block diagram of a fractional-N phase-locked loop having dual charge pumps and an auxiliary charge pump, in accordance with another embodiment.

FIG. 3 shows a block diagram of a fractional-N PLL 300 having dual charge pumps and an auxiliary charge pump, in accordance with another embodiment. In comparison to the PLL 200 shown in FIG. 2, the PLL 300 shown in FIG. 3 removes or substantially reduces the effect of the quantization noise $Q_{NOISE}$ on the tuning line of the VCO 110 in the proportional path of PLL 300, while at the same time having lower overall area compared to the PLL 200 in FIG. 2. In this embodiment, the current sources for the second charge pump 106B have current values of $I_C$ (as in FIG. 2), but the current sources for the first charge pump 106A have current values of $I_C/K$, with K being greater than 1 (e.g. greater than about 5). Hence, the current of the first charge pump 106A is less than the current of the charge pump 106B. In addition, the factor K is used as a scaling factor applied to the capacitance C1 of capacitor 210 in the integral path, such that the value of the capacitor 210 in FIG. 3 is scaled down by a factor of K compared to that in FIG. 2. This may be accomplished because the current value ($I_C/K$) of the integral path is K times smaller than the current value $I_C$ of the proportional path, and thus, the capacitance $C_1$ of the capacitor 210 is magnified K times equivalently. Therefore, the size necessary for the capacitor 210 is greatly reduced (by a factor of K). Using the example illustrated in FIG. 2 where the capacitor 210 had a value of 250 pF, by setting the scaling factor K equal to 10 (i.e. reducing the current value of the first charge pump 106A to be about 10 times less than the current value of the second charge pump 106B), the capacitance $C_1$ of the capacitor 210 may be reduced by K=10 times to be about 25 pF. This reduction in capacitance of capacitor 210 results in a lower area for PLL 300 compared to the PLL 200 shown in FIG. 2. It is noted that although a decrease in current of the first charge pump 106A may increase charge pump noise in the integral path, such noise is low-pass filtered by the loop filter 108. Thus, the reduction in current of the first charge pump 106A may not significantly contribute to output jitter of the PLL 300. Furthermore, use of a larger current $I_C$ in the second charge pump 106B and the auxiliary charge pump 120 (e.g. compared to the current of the first charge pump 106A) can effectively cancel or substantially reduce the quantization noise $Q_{NOISE}$ in the proportional path of PLL 300.

Figure 4:
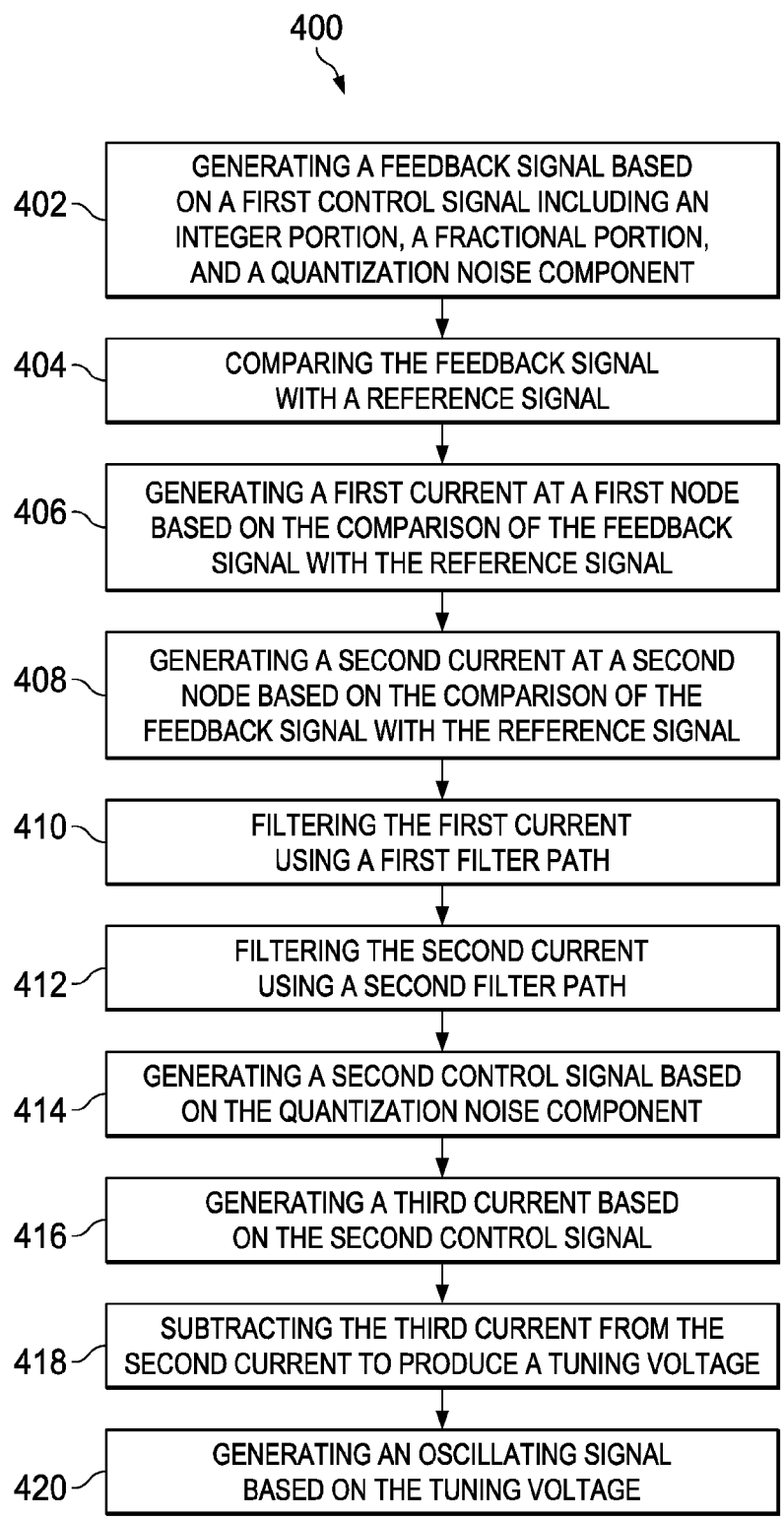
FIG. 4 illustrates a block diagram of a method of operating a phase-locked loop, in accordance with an embodiment.

FIG. 4 illustrates a block diagram of a method 400 of operating a phase-locked loop, in accordance with an embodiment. As an example, the method 400 may be used to operate the PLL 300 shown in FIG. 3. The method 400 includes step 402, which includes generating a feedback signal (e.g. feedback signal 114) based on a first control signal including an integer portion (e.g. $N_{DIV}$), a fractional portion (e.g. $N_{FRAC}$), and a quantization noise component (e.g. $Q_{NOISE}$). Method 400 also includes step 404, which includes comparing the feedback signal with a reference signal (e.g. input signal 102). Step 406 of method 400 includes generating a first current (e.g. by first charge pump 106A) at a first node (e.g. node $V_{IP}$) based on the comparison of the feedback signal with the reference signal. Method 400 includes step 408, which includes generating a second current (e.g. by second charge pump 106B) at a second node (e.g. node $V_{PP}$) based on the comparison of the feedback signal with the reference signal. Method 400 includes step 410, which includes filtering (e.g. by loop filter 108) the first current using a first filter path (e.g. including capacitor 210). Method 400 includes step 412, which includes filtering the second current using a second filter path (e.g. including capacitor 212 and resistor 214). Method 400 also includes step 414, which includes generating a second control signal (e.g. second phase-indicator up signal UP2 and second phase-indicator down signal DN2) based on the quantization noise component (e.g. $Q_{NOISE}$). Method 400 also includes step 416, which includes generating a third current (e.g. by auxiliary charge pump 120) based on the second control signal. Method 400 further includes step 418, which includes subtracting (e.g. by adder 126) the third current from the second current to produce a tuning voltage. Method 400 includes step 420, which includes generating (e.g. by VCO 110) an oscillating signal (e.g. output signal 116) based on the tuning voltage.

Embodiment circuits described herein provide several advantages. Embodiments provide a PLL that has reduced area and reduced noise. In particular, embodiment PLL circuits include dual charge pumps and an isolation buffer that decouples the integral path and the proportional path of the PLL. This allows for independent control over the integral and proportional paths of the PLL without altering the loop parameters of the PLL. Such independent control over the integral and proportional paths of the PLL allows for capacitance multiplication in the integral path by the simultaneous reduction of the current in the charge pump in the integral path and the capacitance of a capacitor in the integral path that determines the zero of the PLL. This leads to the saving of large area typically required for a capacitor that determines a zero of the PLL. Additionally, the independent control over the integral and proportional paths allows for configuration of the charge pump in the proportional path such that it has a greater current compared to the charge pump in the integral path of the PLL. This allows for the effective reduction of quantization noise in the proportional path, which in turn reduces spurious tones and jitter at the output of the PLL.

In an embodiment, a circuit includes a first charge pump configured to generate a first current at a first node, and a second charge pump configured to generate a second current at a second node. The circuit further includes an isolation buffer coupled between the first node and the second node and an adder having a first input coupled to the second node. The circuit additionally includes an auxiliary charge pump configured to generate a third current at a second input of the adder, and an oscillator having an input coupled to an output of the adder.

In an embodiment, a phase locked loop includes a phase detector configured to generate a control signal based on a comparison of a phase of a reference signal to a phase of a feedback signal. The phase locked loop also includes a first charge pump coupled to the phase detector and configured to receive the control signal from the phase detector, and a second charge pump coupled to the phase detector and configured to receive the control signal from the phase detector. The phase locked loop further includes a filter coupled between the first charge pump and the second charge pump, where a first terminal of the filter is coupled to an output of the first charge pump at a first node, and where a second terminal of the filter is coupled to an output of the second charge pump at a second node. The phase locked loop additionally includes an adder having a first terminal coupled to the second node, an auxiliary charge pump having an output coupled to a second terminal of the adder, and an oscillator having an input coupled to an output of the adder.

In an embodiment, a method includes generating a feedback signal based on a first control signal comprising an integer portion, a fractional portion, and a quantization noise component; comparing the feedback signal with a reference signal; and generating a first current at a first node based on the comparison of the feedback signal with the reference signal. The method further includes generating a second current at a second node based on the comparison of the feedback signal with the reference signal, the second current being greater than the first current and filtering the first current using a first filter path. The method additionally includes filtering the second current using a second filter path different from the first filter path, where the second filter path is decoupled from the first filter path by an isolating buffer coupled between the first filter path and the second filter path. The method also includes generating a second control signal based on the quantization noise component of the first control signal; generating a third current based on the second control signal; subtracting the third current from the second current to produce a tuning voltage; and generating an oscillating signal based on the tuning voltage.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The devices and processing systems described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a processor, a digital signal processor (DSP), an Application Specific Integrated Circuit (ASIC), a field programmable gate array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit, comprising:
    a phase detector configured to generate a control signal based on a comparison of a phase of a reference signal to a phase of a feedback signal;
    a first charge pump configured to generate a first current at a first node in response to the control signal;
    a second charge pump configured to generate a second current at a second node in response to the control signal;
    an isolation buffer coupled between the first node and the second node;
    an adder having a first input coupled to the second node;
    an auxiliary charge pump configured to generate a third current at a second input of the adder in response to a second control signal;
    an oscillator having an input coupled to an output of the adder, wherein the oscillator is configured to generate an output signal based on the output of the adder;

a frequency divider circuit having an input coupled to an output of the oscillator, wherein the frequency divider circuit is configured to generate the feedback signal based on the output signal, wherein a ratio of a frequency of the output signal to a frequency of the reference signal comprises an integer portion of a divide ratio and a fractional portion of the divide ratio;

a first fractional control module configured to provide a first factor to the frequency divider circuit, the first factor comprising the fractional portion of the divide ratio and quantization noise;

an integrating circuit having an input coupled to an output of the first fractional control mode, the integrating circuit being configured to generate a phase signal based on the quantization noise; and a second fractional control module having an input coupled to an output of the integrating circuit, the second fractional control module being configured to generate the second control signal based on the phase signal.

2. The circuit of claim 1, wherein the second current is different from the first current.

3. The circuit of claim 2, wherein the second current is greater than the first current by a factor greater than 1.

4. The circuit of claim 1, wherein the third current is substantially equal to the first current.

5. The circuit of claim 1, further comprising:
a first filter path comprising a first capacitor coupled between the first node and a reference voltage; and
a second filter path comprising a second capacitor and a resistor, the second capacitor being coupled between the second node and the reference voltage, the resistor being coupled between the second node and an output of the isolation buffer.

6. The circuit of claim 1, wherein the isolation buffer comprises an operational amplifier.

7. The circuit of claim 6, wherein the operational amplifier is configured as a unity gain buffer.

8. The circuit of claim 1, wherein the first input of the adder is a summing terminal of the adder, and wherein the second input of the adder is a subtracting terminal of the adder.

9. A phase locked loop, comprising:
a phase detector configured to generate a control signal based on a comparison of a phase of a reference signal to a phase of a feedback signal;
a first charge pump coupled to the phase detector and configured to receive the control signal from the phase detector;
a second charge pump coupled to the phase detector and configured to receive the control signal from the phase detector;
a filter coupled between the first charge pump and the second charge pump, a first terminal of the filter coupled to an output of the first charge pump at a first node, a second terminal of the filter coupled to an output of the second charge pump at a second node;
an adder having a first terminal coupled to the second node;
an auxiliary charge pump having an output coupled to a second terminal of the adder;
an oscillator having an input coupled to an output of the adder; and
a fractional control module configured to provide a second control signal to the auxiliary charge pump.

10. The phase locked loop of claim 9, wherein the filter comprises a first filter path coupled to the first node and a second filter path coupled to the second node, the filter further comprising an isolation buffer coupled between the first filter path and the second filter path.

11. The phase locked loop of claim 10, wherein the first filter path comprises a first capacitor coupled between the first node and a reference voltage, and wherein the second filter path comprises a second capacitor and a resistor, the resistor being coupled between an output of the isolation buffer and the second node, the second capacitor being coupled between the second node and the reference voltage.

12. The phase locked loop of claim 11, wherein a capacitance of the first capacitor is larger than a capacitance of the second capacitor.

13. The phase locked loop of claim 9, wherein a current of the first charge pump is less than a current of the second charge pump by a factor greater than 1.

14. A method, comprising:
generating a feedback signal based on a first control signal comprising an integer portion, a fractional portion, and a quantization noise component;
comparing the feedback signal with a reference signal;
generating a first current at a first node based on the comparison of the feedback signal with the reference signal;
generating a second current at a second node based on the comparison of the feedback signal with the reference signal, the second current being greater than the first current;
filtering the first current using a first filter path;
filtering the second current using a second filter path different from the first filter path, the second filter path decoupled from the first filter path by an isolating buffer coupled between the first filter path and the second filter path;
generating a second control signal based on the quantization noise component of the first control signal;
generating a third current based on the second control signal;
subtracting the third current from the second current to produce a tuning voltage; and
generating an oscillating signal based on the tuning voltage.

15. The method of claim 14, wherein generating the feedback signal comprises generating the feedback signal based on the oscillating signal and the first control signal.

16. The method of claim 14, wherein generating the first current at the first node comprises controlling a pair of electronic switches of a first charge pump, wherein an output of the first charge pump is coupled to the first node.

17. The method of claim 14, wherein generating the second current at the second node comprises controlling a pair of electronic switches of a second charge pump, wherein an output of the second charge pump is coupled to the second node.

18. The method of claim 14, wherein generating the third current based on the second control signal comprises controlling a pair of electronic switches of an auxiliary charge pump.

19. The method of claim 14, wherein the second current is greater than the first current by a factor greater than about 5.

20. The circuit of claim 1, wherein the first fractional control module comprises an accumulator or a sigma-delta modulator.

* * * * *